(12) United States Patent
Morimoto et al.

(10) Patent No.: US 8,459,442 B2
(45) Date of Patent: Jun. 11, 2013

(54) ARTICLE TRANSPORT FACILITY

(75) Inventors: Yuichi Morimoto, Omihachiman (JP); Takeshi Chuma, Gifu (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 13/482,523

(22) Filed: May 29, 2012

(65) Prior Publication Data

US 2012/0305364 A1 Dec. 6, 2012

(30) Foreign Application Priority Data

May 31, 2011 (JP) ................................. 2011-122289

(51) Int. Cl.
*B65G 49/07* (2006.01)

(52) U.S. Cl.
USPC ................. 198/468.6; 198/346.3; 198/468.3; 414/222.07

(58) Field of Classification Search
USPC . 198/346.3, 465.4, 468.3, 468.6; 414/222.07, 414/222.13, 744.3, 744.7
See application file for complete search history.

(56) References Cited

U.S. PATENT DOCUMENTS

| | | | | |
|---|---|---|---|---|
| 4,820,102 A * | 4/1989 | Messerly et al. | ........... | 414/788.9 |
| 5,469,953 A * | 11/1995 | Igarashi et al. | ........... | 198/345.2 |
| 6,321,138 B1 * | 11/2001 | Livesay et al. | ................ | 700/245 |
| 6,468,021 B1 * | 10/2002 | Bonora et al. | ................ | 414/522 |
| 6,699,329 B2 * | 3/2004 | Mueller et al. | ................ | 118/641 |
| 6,702,099 B2 * | 3/2004 | Otaguro et al. | ............ | 198/468.6 |
| 6,854,583 B1 * | 2/2005 | Horn | ............................. | 198/348 |
| 6,889,813 B1 * | 5/2005 | Trammell et al. | .......... | 198/346.3 |
| 6,971,500 B2 * | 12/2005 | Horn | ............................. | 198/348 |
| 7,578,650 B2 * | 8/2009 | Aalund et al. | ................ | 414/806 |
| 7,780,392 B2 * | 8/2010 | Rogers et al. | ................ | 414/267 |
| 8,205,558 B2 * | 6/2012 | Horn et al. | ...................... | 104/91 |

FOREIGN PATENT DOCUMENTS

| | | |
|---|---|---|
| JP | 200644920 A | 2/2006 |
| JP | 200652065 A | 2/2006 |
| JP | 2006319154 A | 11/2006 |

* cited by examiner

*Primary Examiner* — Douglas Hess
(74) *Attorney, Agent, or Firm* — The Webb Law Firm

(57) ABSTRACT

An inter-travel-paths transport device transports articles between a first article transfer location and a second article transfer location. It extends in a space upwardly of the article processing devices and connects the first and second article transfer locations. A first transport device transfers an article to or from an article transferring point by vertically moving its holding portion and of transferring an article to or from the first article transfer location by slidingly moving the holding portion at a position which overlaps with the first travel path portion. A second movement slide transport device vertically transfers an article to or from an article transferring point in the same manner with respect to the second travel path portion.

5 Claims, 6 Drawing Sheets

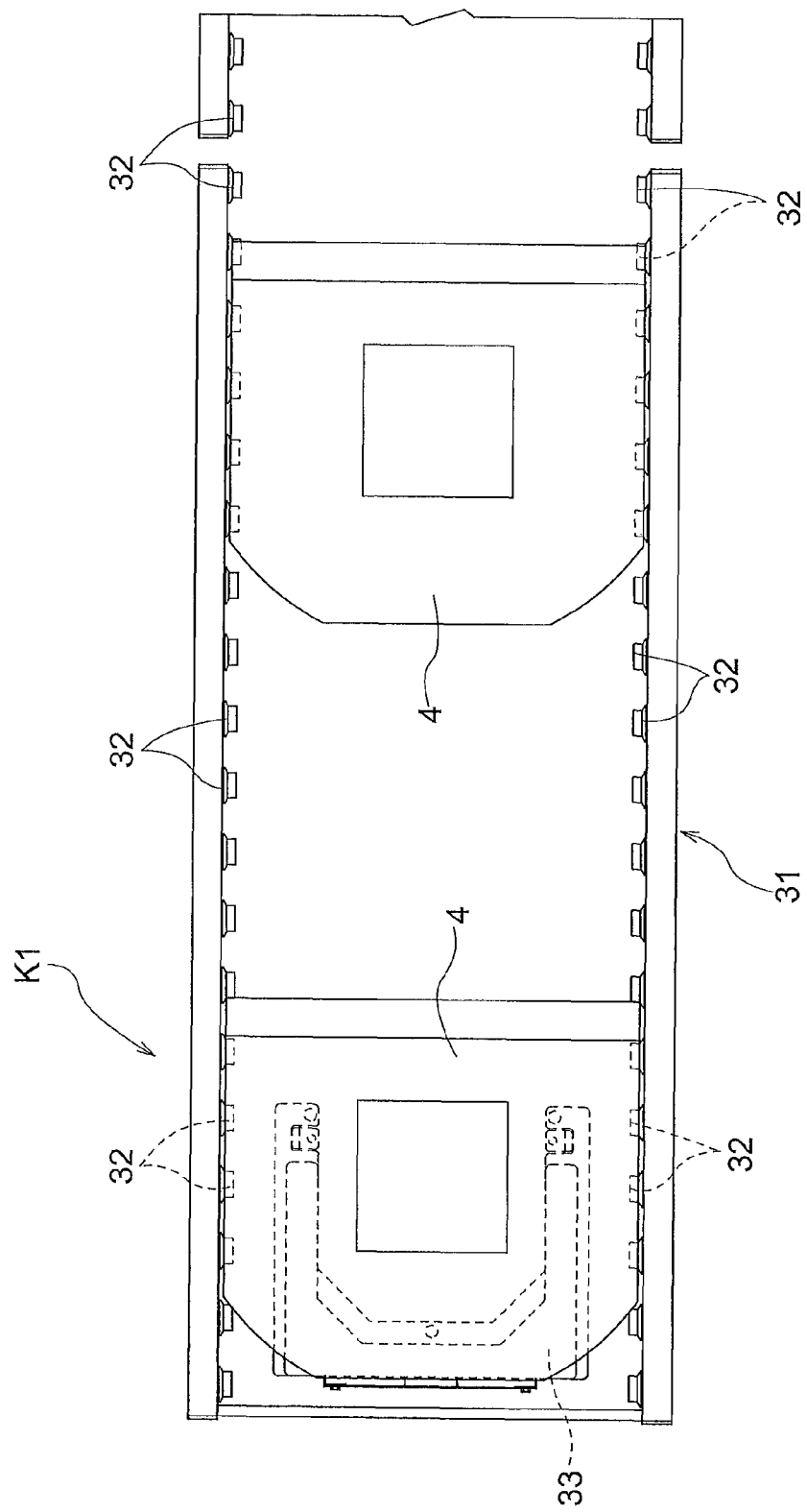

ARTICLE TRANSPORT FACILITY

BACKGROUND OF THE INVENTION

1. Field of the Invention

The present invention relates to an article transport facility and more particularly to an article transport facility comprising two or more article processing devices installed on the ground side and an article transferring point provided on the ground side in association with each of the article processing devices, a plurality of article transport vehicles that transport articles among the article processing devices, and travel paths which are installed on the ceiling side and in which the plurality of article transport vehicles travel.

2. Description of the Related Art

In article transport facilities such as one described above, because a travel path along which an article transport vehicle travels is installed on the ceiling side or to the ceiling and because article processing devices and the article transferring points for the article processing devices are installed on the ground, the article transport vehicle is provided with a grip portion for gripping an article such that the gripping portion can be moved vertically. Thus, an article transport vehicle travels along the travel path to a stop position that is associated with an article transferring point and transfers an article to or from the article transferring point for the article processing device by vertically moving, i.e. by raising and lowering the grip portion. (See, for example, JP Application Publication No. 2006-319154).

In the facility described in the JP No. 2006-319154 above, the travel path includes a plurality of intra-process looped tracks that extend along or by way of a plurality of article transferring points in plan view, and an inter-process looped track that is connected with the plurality of intra-process looped tracks to allow the article transport vehicles to travel between the intra-process looped tracks. Two or more intra-process looped tracks are arranged next to each other in the lateral direction of the path. And each of the intra-process looped tracks and the inter-process looped track consists of a pair of straight portions which face or oppose each other and curved portions which connect the straight portions. Thus, between two intra-process looped tracks which are located next to each other in the path lateral direction of the intra-process looped tracks, a plurality of article processing devices provided in association with one of the intra-process looped tracks are arranged next to each other along its path longitudinal direction and a plurality of article processing devices provided in association with the other of the intra-process looped tracks are arranged next to each other along its path longitudinal direction. Therefore, for the intra-process looped tracks that are located next to each other in the path lateral direction, a straight portion in one of the intra-process looped tracks is a first travel path portion, and a straight portion in the other of the intra-process looped tracks is a second travel path portion.

In JP No. 2006-319154 described above, the transporting efficiency is improved by providing two or more article transport vehicles and by transporting a plurality of articles by the two or more article transport vehicles. However, for example, when an article is transported from the article processing device provided in association with the first travel path portion to an article processing device provided in association with the second travel path portion, the article transport vehicle must travel first on the first travel path portion which is the straight portion in the intra-process looped track, then on the inter-process looped track, and on the second travel path portion which is the straight portion in the intra-process looped track in that order. And it takes a long time to transport the article because of the long distance traveled by the article transport vehicle. In addition, when the article transport vehicle travels on the first travel path portion, an inter-process looped track, and the second travel path portion in order, other article transport vehicles may get in the way, which makes it difficult to travel smoothly. This may also increase the time required to transport an article between an article processing device provided in association with the first travel path portion and an article processing device provided in association with the second travel path portion, thus further reducing the transport efficiency.

To this end, if articles are transported from the article processing device provided in association with the first travel path portion to an article processing device provided in association with the second travel path portion, for example, by providing an inter-travel-paths transport device such as a conveyor for transporting articles between the first travel path portion and the second travel path portion, this inter-travel-paths transport device may be used to shorten the time required to transport articles. However, it is difficult to secure the installation space for such an inter-travel-paths transport device because a number of article processing devices are installed and arranged on the ground along the path longitudinal direction between the first travel path portion and the second travel path portion. That is, a plurality of article processing devices are installed and arranged along the path longitudinal direction between the first travel path portion and the second travel path portion with minimum distances in the path longitudinal direction between article processing devices in order to have as many article processing devices as possible in that space. Therefore, the space for installing an inter-travel-paths transport device can not be secured between the plurality of article processing devices arranged along the path longitudinal direction; thus, the space for installing the inter-travel-paths transport device is limited to the space above the article processing devices.

We note that the article transport vehicle transfers an article to or from a transfer target, such as an article transferring point, by vertically moving the grip portion for gripping an article. Therefore, when an article transport vehicle transfers an article to or from an inter-travel-paths transport device, a sufficient space is required to lower the article gripped by the grip portion to a level lower than the article transport vehicle. Thus, the inter-travel-paths transport device has to be installed at a height that is that much lower than otherwise. As the result, even if an attempt were made to install an inter-travel-paths transport device in the space above the article processing devices, the inter-travel-paths transport device would interfere with an article processing device, thus making it impossible to install an inter-travel-paths transport device in the space above the article processing devices.

SUMMARY OF THE INVENTION

The present invention was made in light of this problem, and its object is to provide an article transport facility in which the space above an article processing device is effectively utilized to install an inter-travel-paths transport device etc. for transporting articles between the first travel path portion and the second travel path portion, and in which the time required to transport articles between an article processing device provided in association with the first travel path portion and an article processing device provided in association with the second travel path portion is reduced, thus increasing transport efficiency.

To achieve this object, an article transport facility in accordance with the present invention comprises: An article transport facility comprising: two or more article processing devices installed on the ground side and an article transferring point provided on the ground side in association with each of the article processing devices; a plurality of article transport vehicles that transport articles among the article processing devices; travel paths which are installed on the ceiling side and in which the plurality of article transport vehicles travel, the travel paths including a first travel path portion and a second travel path portion which are spaced apart from each other in a path lateral direction wherein a plurality of the article processing devices are arranged along a path longitudinal direction between the first travel path portion and the second travel path portion such that at least one article processing device and an associated article transferring point are located in association with the first travel path portion and such that at least one article processing device and an associated article transferring point are located in association with the second travel path portion; an inter-travel-paths transport device that extends in a space upwardly of the article processing devices arranged between the first travel path portion and the second travel path portion, to transport an article between a first article transfer location located laterally of the first travel path portion and on a second travel path portion side in plan view and a second article transfer location located laterally of the second travel path portion and on a first travel path portion side in plan view wherein the inter-travel-paths transport device is positioned to connect the first article transfer location and the second article transfer location; a first vertical movement slide transport device that is fixedly or movably located in an area of the first travel path portion, the first vertical movement slide transport device having a holding portion for holding an article such that the holding portion can be moved vertically and can be slidingly moved in the lateral direction of the first travel path portion, wherein the first vertical movement slide transport device is configured to transfer an article to or from the article transferring point of the at least one article processing device located in association with the first travel path portion by vertically moving the holding portion at a position that overlaps with the first travel path portion in plan view and to transfer an article to or from the first article transfer location by slidingly moving the holding portion in the path lateral direction of the first travel path portion; a second vertical movement slide transport device that is fixedly or movably located in an area of the second travel path portion, the second vertical movement slide transport device having a holding portion for holding an article such that the holding portion can be moved vertically and can be slidingly moved in the lateral direction of the second travel path portion, wherein the second vertical movement slide transport device is configured to transfer an article to or from the article transferring point of the at least one article processing device located in association with the second travel path portion by vertically moving the holding portion at a position that overlaps with the second travel path portion in plan view and to transfer an article to or from the second article transfer location by slidingly moving the holding portion in the path lateral direction of the second travel path portion.

With such a configuration, since each of the first and second vertical movement slide transport device includes the holding portion that can be slidingly moved in the path lateral direction of the corresponding path portion, the vertical movement slide transport device can transfer an article to or from the first article transfer location located at a position laterally of the first travel path portion in plan view or the second article transfer location located at a position laterally of the second travel path portion by slidingly moving the holding portion at a position that overlaps in plan view with the corresponding path portion between the first travel path portion and the second travel path portion. Therefore, it is not necessary to secure a space for lowering the article held by the holding portion from the height of this vertical movement slide transport device when transferring an article between the first or second vertical movement slide transport device and the inter-travel-paths transport device. This allows these vertical movement slide transport devices to be installed upwardly of the article processing devices and the inter-travel-paths transport device to be installed at a comparable height as these vertical movement slide transport devices. And thus an installation space for the inter-travel-paths transport device can be secured in the space upwardly of the article processing devices without the inter-travel-paths transport device interfering with the article processing devices. Therefore, the inter-travel-paths transport device can be installed such that it extends in the space upwardly the article processing devices and such that it connects the first article transfer location located laterally of the first travel path portion and on the second travel path portion side and the second article transfer location located laterally of the second travel path portion and on the first travel path portion side.

For example, when transporting an article from an article processing device provided in association with the first travel path portion to an article processing device provided in association with the second travel path portion, the first vertical movement slide transport device located in the area of the first travel path portion can vertically move its holding portion to receive the article from the article transferring point of the article processing device. And the first vertical movement slide transport device can slidingly move the holding portion to transfer the received article to the first article transfer location. And the inter-travel-paths transport device can transport the article, that has been transferred to the first article transfer location, to the second article transfer location from the first article transfer location. The second vertical movement slide transport device located in the area of the second travel path portion can receive the article from the second article transfer location by slidingly moving its holding portion and can transfer the received article to the article transferring point of the article processing device by vertically moving the holding portion. Thus, articles can be transported directly between the first travel path portion and the second travel path portion by using the first and second vertical movement slide transport devices and the inter-travel-paths transport device. And the articles can be transported between an article processing device provided in association with the first travel path portion and an article processing device provided in association with the second travel path portion without increasing the distance traveled by the article transport vehicle.

Therefore an article transport facility is provided in which the space located upwardly of article processing devices is utilized effectively to install an inter-travel-paths transport device which transports articles between the first article transfer location and the second article transfer location, and in which the time required to transport articles between an article processing device provided in association with the first travel path portion and an article processing device provided in association with the second travel path portion is reduced using the inter-travel-paths transport device, to improve transport efficiency.

BRIEF DESCRIPTION OF THE DRAWINGS

FIG. 6 is a plan view of an inter-travel-paths transport device.

DESCRIPTION OF THE BEST EMBODIMENT

Figure 1:
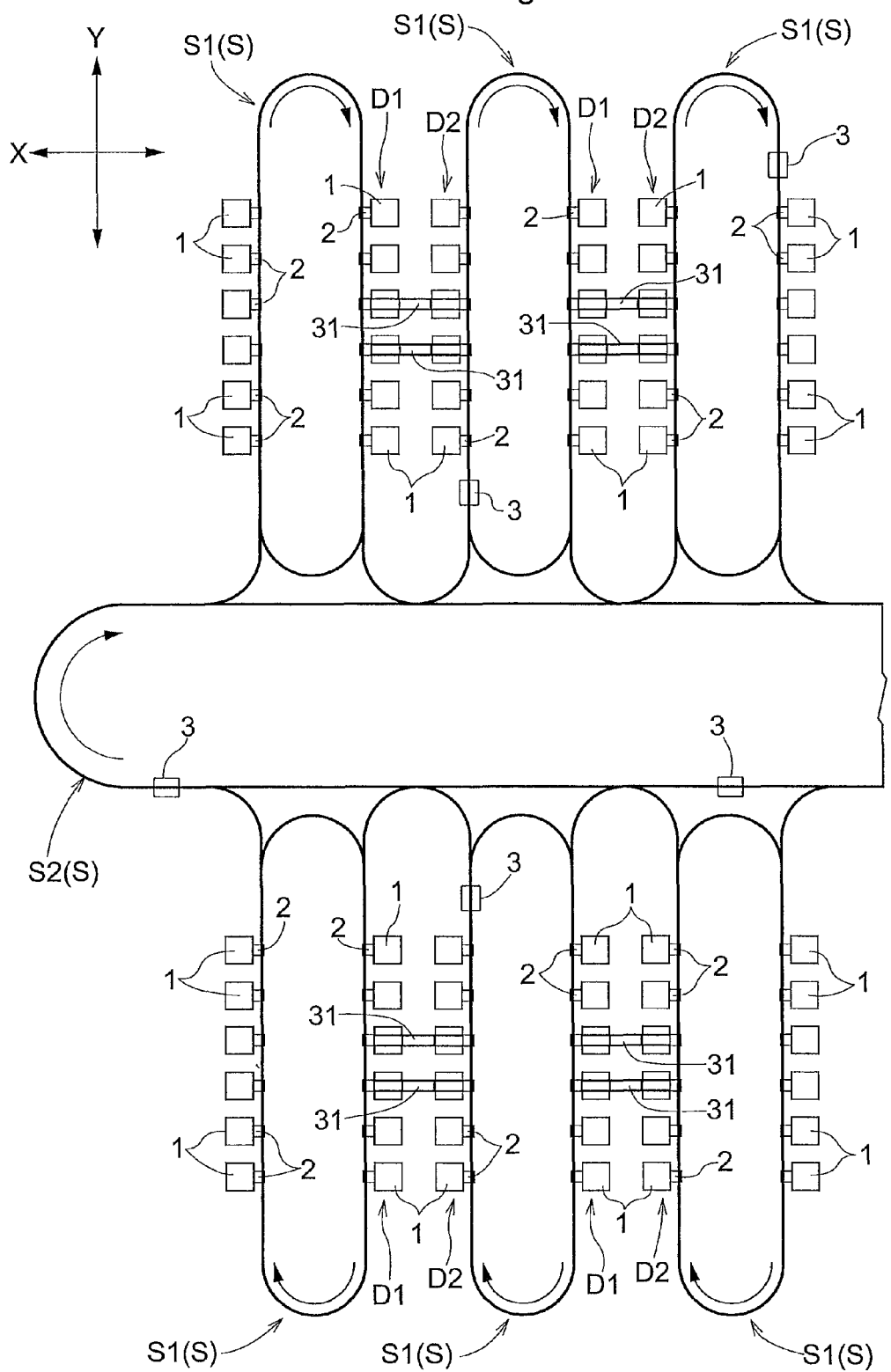
FIG. 1 is a plan view of an article transport facility.
Figure 2:
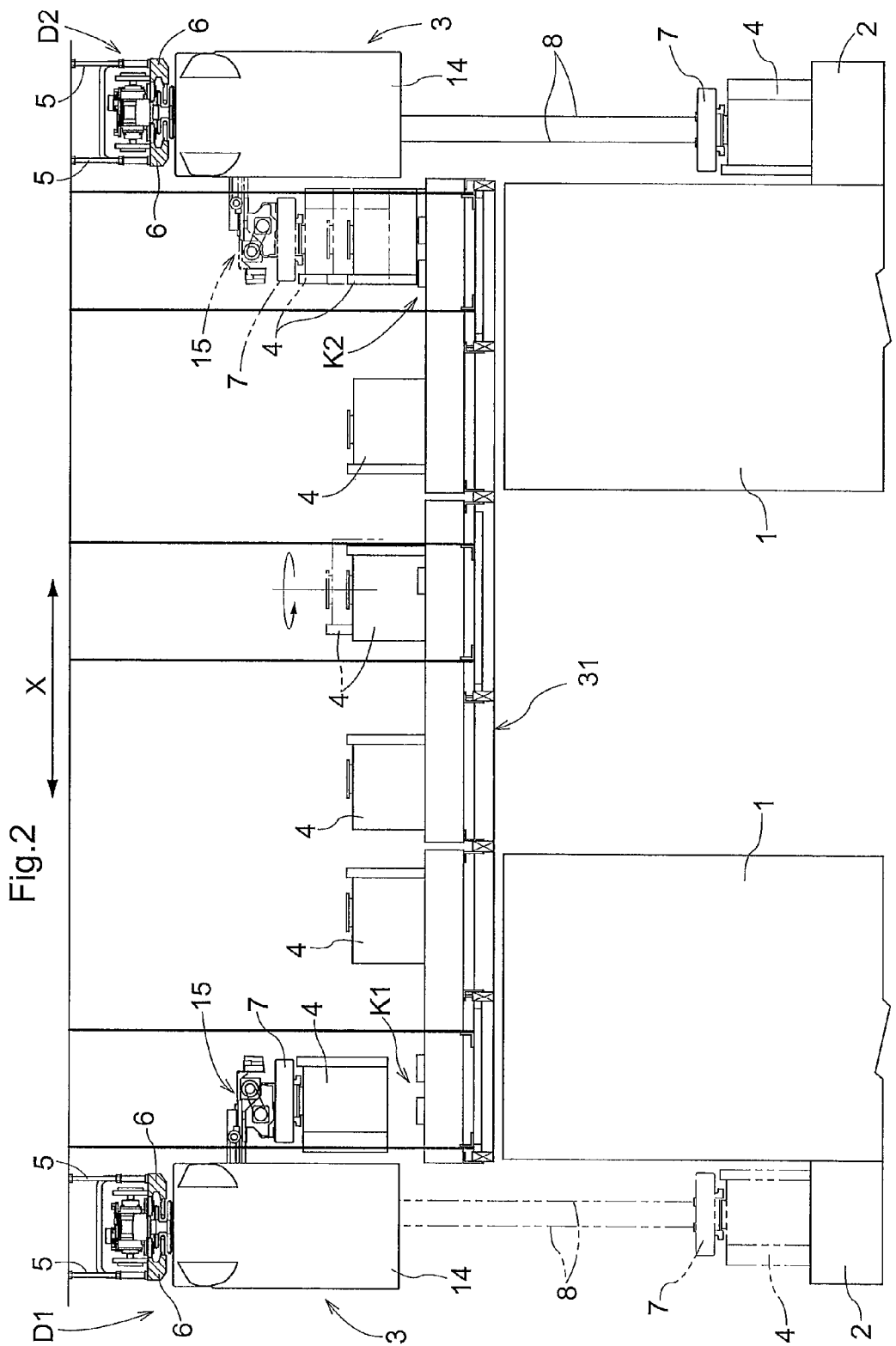
FIG. 2 is a side view showing a principal part of the article transport facility.

An embodiment of the article transport facility in accordance with the present invention is described next with reference to the drawings. As shown in FIGS. 1 and 2, installed on the ground in this article transport facility are two or more article processing devices 1 and stations 2 (article transferring points) each of which is provided for the associated article processing device 1. And the travel paths S along which the article transport vehicles 3 (for transporting articles 4 among the plurality of article processing devices 1) travel are installed to the ceiling or on the ceiling side. Containers for housing semiconductor substrates are transported as articles 4 in this article transport facility. And the article transport vehicles 3 are configured to transport the articles 4 among the plurality of article processing devices 1. FIG. 1 is a schematic plan view of the article transport facility where some parts of the article transport facility are not shown. FIG. 2 is a side view of a principal part of the article transport facility.

The travel paths S include travel rails 6 fixedly installed to the ceiling by means of suspending supports 5. As shown in FIG. 1, the travel paths S are constructed to extend by or along each of the stations 2 (article transferring points) for the plurality of article processing devices 1. And two or more article transport vehicles 3 of the ceiling travel type which can travel in one direction along the travel paths S are provided. The travel paths S include a plurality (six in FIG. 1) of loop-shaped station-route portions S1 that extend by or along the stations for the plurality of article processing devices 1, and a loop-shaped connecting portion S2 (a part of which is not shown in FIG. 1) which connects the plurality of station-route portions S1. Each of the station-route portion S1 and the connecting portion S2 includes a pair of straight portions and curved portions which connect the pair of straight portions. Two or more station-route portions S1 are arranged next to each other along the path lateral direction (direction shown at X in FIG. 1). Provided in association with straight portions in each of the plurality of station-route portions S1 are a plurality of article processing devices 1 that are arranged along a path longitudinal direction (direction shown at Y in FIG. 1). And the straight portions in the station-route portions S1 are provided such that they extend approximately directly above (that is, substantially directly above) the plurality of stations 2 in plan view.

As shown in FIG. 2, the article transport vehicle 3 includes and supports a grip portion 7 for gripping an article 4 with the article being suspended from the grip portion 7 such that the grip portion 7 can be moved vertically (or raised or lowered) and can be slidingly moved in a path lateral direction (direction X in FIG. 2) of the travel path S. The grip portion 7 can be vertically moved between a raised position near the article transport vehicle 3 and a lowered position for transferring an article to and from the station 2 by causing belts 8, described below, to be spooled or fed out with the article transport vehicle 3 stopped at a location. It is also possible to use wires, for example, in place of the belts 8.

Each station 2 has a supporting platform which receives and supports an article 4. And each station 2 is provided to receive from the article transport vehicle 3 articles 4 on which predetermined processing is to be performed by the associated article processing device 1 and to deliver to the article transport vehicle 3 articles 4 on which predetermined processing has been performed by the associated article processing device 1. One station 2 is located in association with each of the plurality of article processing devices 1. Each article transport vehicle 3 is configured to travel along travel paths S with the grip portion 7 in the raised position and to transfer an article 4 to or from the station 2 by lowering and raising the grip portion 7 between the raised position and the lowered position while the article transport vehicle 3 is stopped at a stop position associated with a transfer target station 2 among the plurality of stations 2.

(Article Transport Vehicles)

Figure 3:
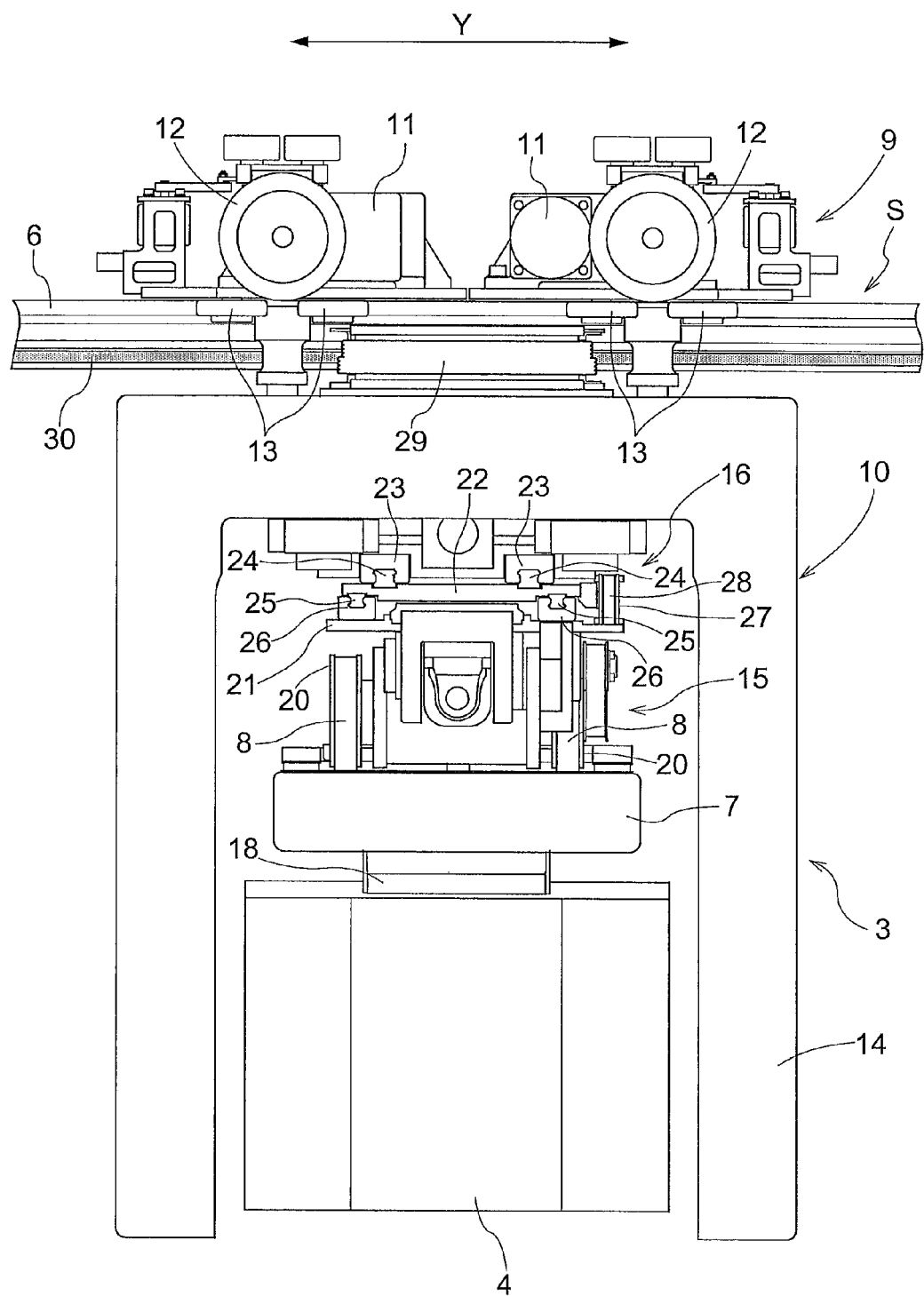
FIG. 3 is a side view of the article transport vehicle, FIG. 4 a front view of an article transport vehicle.
Figure 4:
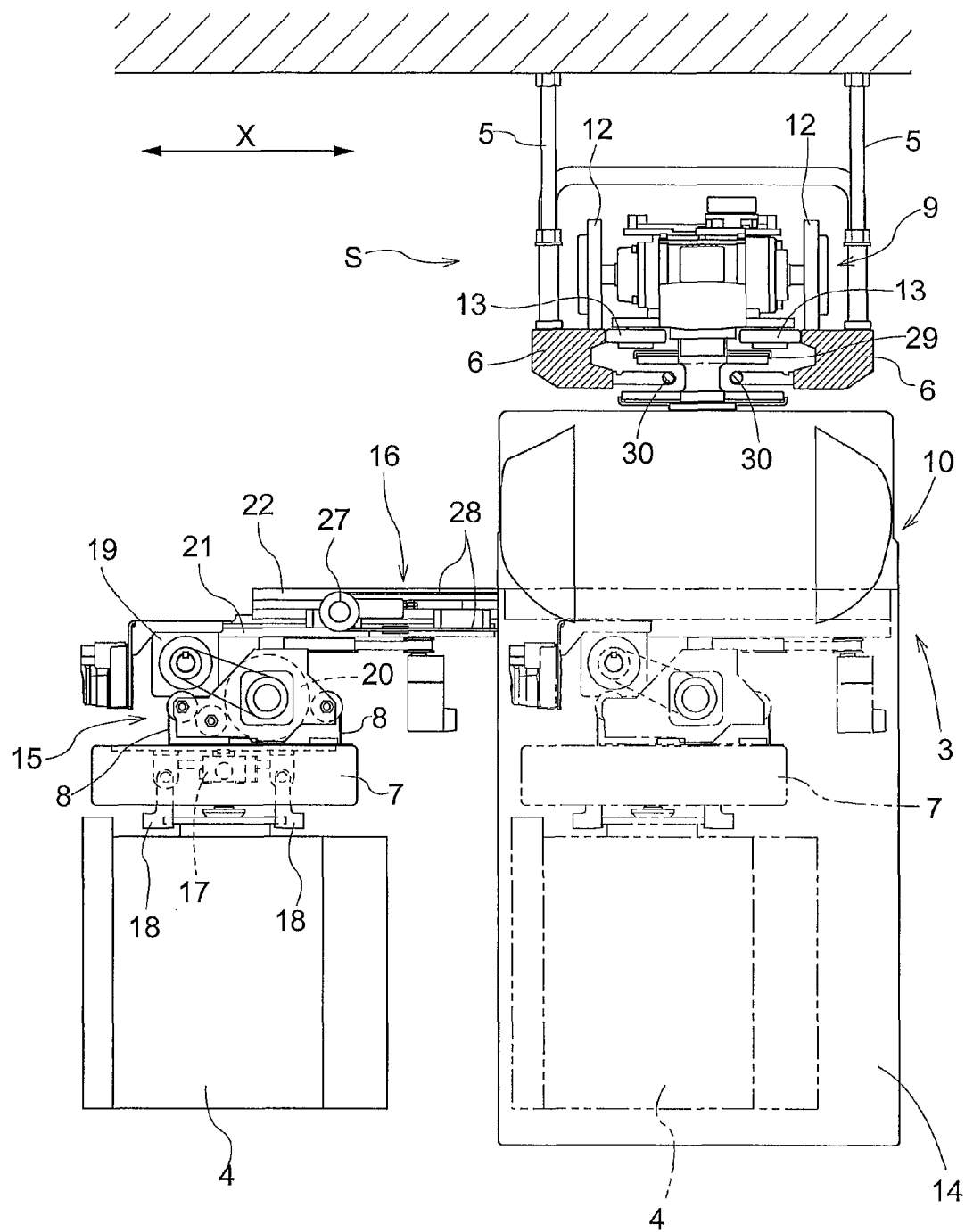

As shown in FIGS. 3 and 4, each article transport vehicle 3 includes a travel driving unit 9 which travels on travel rails 6 and an article support 10 suspended and supported by the travel driving unit 9 such that the article support 10 is located under the travel rails 6. FIG. 3 shows a side view as seen along the path lateral width direction (i.e. as seen along the direction X in FIG. 4) of the article transport vehicle 3 located in one of the station-route portions S1. FIG. 4 shows a front view of the article transport vehicle 3 as seen in the path longitudinal direction (direction Y in FIG. 3) of the travel path S, wherein the state in which the grip portion 7 is slidingly moved to a side of and close to the travel path S in plan view (that is a position lateral of the travel path S) is shown with solid lines whereas the state in which the grip portion 7 overlaps with the travel path S in plan view is shown with dotted lines.

A pair of left and right travel rails 6 are provided such that they are spaced apart from each other in the path lateral direction (direction X in FIG. 4). Provided to the travel driving unit 9 are travel wheels 12 each of which is rotated and driven by a drive motor 11 and rolls on a horizontally-extending top surface of the respective one of the pair of right and left travel rails 6 and travel guide wheels 13 which can rotate and contact or abut on vertically extending side faces—of the pair of right and left travel rails 6—that face each other. And the article transport vehicle 3 is configured to travel while being guided by the travel rails 6 by virtue of the fact that each travel wheel 12 is rotated or driven by the drive motor 11 about an axis that extends in a lateral width direction (i.e. a horizontal direction) of the article transport vehicle 3 and that the travel guide wheels 13, each of which can rotate about a vertical axis, abut and are guided by the pair of right and left travel rails 6.

A pair of right and left travel wheels 12 are located at lateral ends of the article transport vehicle 3. And two such pairs of right and left travel wheels 12 are provided such that one pair is spaced apart from the other pair in the fore and aft direction of the article transport vehicle 3 with a total of four travel wheels 12 provided on each article transport vehicle 3. Four travel guide wheels 13 are provided on one lateral side of the article transport vehicle 3 and four travel guide wheels 13 are provided on the other lateral side of the article transport vehicle 3. And on each side, two of the four travel guide wheels 13 are located in front of and behind the front travel wheel 12 whereas the remaining two of the four travel guide wheels 13 are located in front of and behind the rear travel wheel 12. Therefore, on each side, two of the travel guide wheels 12 are provided to be spaced apart in the fore and aft direction of the article transport vehicle 3 from the other two travel guide wheels 12 with a total of eight travel guide wheels 13 provided on each article transport vehicle 3.

The article support 10 includes a cover 14 that has a concave shape (i.e. a bracket shape) in a side view and that extends in the path longitudinal direction (direction Y in FIG. 3) with its forward end portion and its back end portion extending downward and with its central portion extending in the fore and aft direction. And the grip portion 7 is located in a space between the forward end portion and the back end portion of the cover 14. The cover 14 is open to the area below and the article support 10 raises and lowers the grip portion 7 through the open space. In addition, the both sides in the path lateral direction (direction X in FIG. 4) of the cover 14 are also open, and the grip portion 7 is caused to be slidingly moved in the path lateral direction (direction X in FIG. 4) through the open space. The article support 10 has a vertical movement operation mechanism 15 which raises and lowers, or vertically move, the grip portion 7, and a sliding movement operation mechanism 16 which slidingly moves the grip portion 7 together with the vertical movement operation mechanism 15 in the path lateral direction (direction X in FIG. 4).

The grip portion 7 includes a gripper 18 which can be switched by the gripper motor 17 between a gripping attitude in which an article 4 is gripped and a grip release attitude in which the grip is released. The vertical movement operation mechanism 15 includes a rotating drum 20 for spooling the belts 8 that is rotated by a vertical movement motor 19. The vertical movement operation mechanism 15 is configured to vertically move the grip portion 7 and an article 4 gripped by the grip portion 7 by having the rotating drum 20 drivingly rotated by the vertical movement motor 19, and to grip an article 4 or to release the grip of the article 4 by changing the attitude of the gripper 18 by means of the gripper motor 17.

The grip portion 7 and the vertical movement operation mechanism 15 are provided to (i.e., supported by) the slide movement member 21. The intermediate slide movement member 22 is interposed between the slide movement member 21 and the cover 14 to allow the slide movement member 21 to be slid or moved in the path lateral direction (direction X in FIG. 4) with respect to the cover 14. This allows the grip portion 7 and the vertical movement operation mechanism 15 to be slidingly moved in the path lateral direction (direction X in FIG. 4) with respect to the cover 14. As shown in FIG. 3, the intermediate slide movement member 22 is supported by the cover 14 by means of first slide rails 23 provided to the cover 14 and second slide rails 24 provided to the top surface portions of the intermediate slide movement member 22 for sliding movement with respect to the cover 14 in the path lateral direction (direction X in FIG. 4). The slide movement member 21 is supported by the intermediate slide movement member 22 by means of third slide rails 25 provided to the undersurface portions of the intermediate slide movement member 22 and fourth slide rails 26 provided to the slide movement member 21 for movement in the path lateral direction (direction X in FIG. 4) with respect to the intermediate slide movement member 22.

The sliding movement operation mechanism 16 includes an endless belt 28 that is run over a pair of rotation pulleys 27 (only one of which, and not the other, is shown in FIG. 4) that are spaced apart from each other in the path lateral direction (direction X in FIG. 4) and a motor (not shown) for the sliding movement, for rotating the rotation pulley 27 to drivingly circulate the endless belt 28. And one of the intermediate portions of the endless belt 28 that are located between the pair of rotation pulleys 27 is connected to the cover 14 whereas the other of the intermediate portions is connected to the slide movement member 21. This causes the intermediate portion of the endless belt 28 that is connected to the cover 14 and the intermediate portion of the endless belt 28 that is connected to the slide movement member 21 to move in opposite directions along the path lateral direction (direction X in FIG. 4) when the endless belt 28 is drivingly circulated. Therefore, since the cover 14 and the slide movement member 21 side will slide in opposite directions along the path lateral direction (direction X in FIG. 4) with respect to the intermediate slide movement member 22, the direction in which the intermediate slide movement member 22 slides with respect to the cover 14 coincides with the direction in which the slide movement member 21 slides with respect to the intermediate slide movement member 22. Therefore, the sliding movement operation mechanism 16 causes the intermediate slide movement member 22 to be slidingly moved with respect to the cover 14 and the slide movement member 21 to be slidingly moved with respect to the intermediate slide movement member 22 by drivingly circulating the endless belt 28 by means of the motor for sliding movement (not shown) in order to cause the grip portion 7 and the vertical movement operation mechanism 15 to be slid and moved with respect to the cover 14. And the sliding movement operation mechanism 16 is configured to slidingly move the grip portion 7 and the vertical movement operation mechanism 15 between a position at which the grip portion 7 and the vertical movement operation mechanism 15 overlaps with the travel path S in plan view (see position shown with dotted lines in FIG. 4) and a position that is off to a side of the travel path S (i.e., lateral of and near the travel path S) in plan view (see the position shown with solid lines in FIG. 4) by drivingly circulating the endless belt 28 in one direction and in the opposite direction by means of the motor for sliding movement (not shown).

The article transport vehicle 3 is provided with a power receiving coil 29 in a center portion with respect to the fore and aft direction and to the lateral direction of the article transport vehicle 3, and is configured to receive driving electric power from electricity supply lines 30 through this power receiving coil 29. A pair of right and left electricity supply lines 30 are provided such that they are supported by the travel rails 6. And the pair of right and left electricity supply lines 30 are located and arranged between the pair of right and left travel rails 6 such that they are spaced apart from each other in the lateral direction of the article transport vehicle 3 and such that they extend in along the travel rails 6. And magnetic field is generated by applying alternating current to the electricity supply lines 30, which magnetic field causes the power receiving coil 29 to generate driving electric power so that driving electric power is supplied to the article transport vehicle 3 without any contacting parts. With the driving electric power supplied from the electricity supply line 30 to the power receiving coil 29, the article transport vehicle 3 is configured to cause the travel driving unit 9 to travel, and to vertically move the grip portion 7, etc. with the driving electric power.

(First Travel Path Portion and Second Travel Path Portion)

Referring back to FIG. 1, the straight portion in the station-route portion S1 is formed such that the portion extends along or by way of a plurality of stations 2 in plan view. And in the area between one station-route portion S1 and another (or the other) station-route portion S1 that is located next to the one station-route portion S1 in the path lateral direction (direction X in FIG. 1) of the station-route portion S1, a plurality of article processing devices 1 provided in association with the one station-route portion S1 are located and installed in a row along the path longitudinal direction (direction Y in FIG. 1), and a plurality of article processing devices 1 provided in association with the other station-route portion S1 are also located and installed in a row along the path longitudinal direction (direction Y in FIG. 1). Therefore, the straight portion in the one station-route portion S1 defines a first travel path portion D1, and the straight portion in the other station-route portion S1 defines a second travel path portion D2. Since the example shown in FIG. 1 has a total of four station-route portions S1 which are located next to each other in the path lateral direction (direction X in FIG. 1) of the station-route portion S1, there are four sets of the pairs each consisting of the first travel path portion D1 and the second travel path portion D2.

(Intra-Travel-Paths Transport Device)

Figure 5:
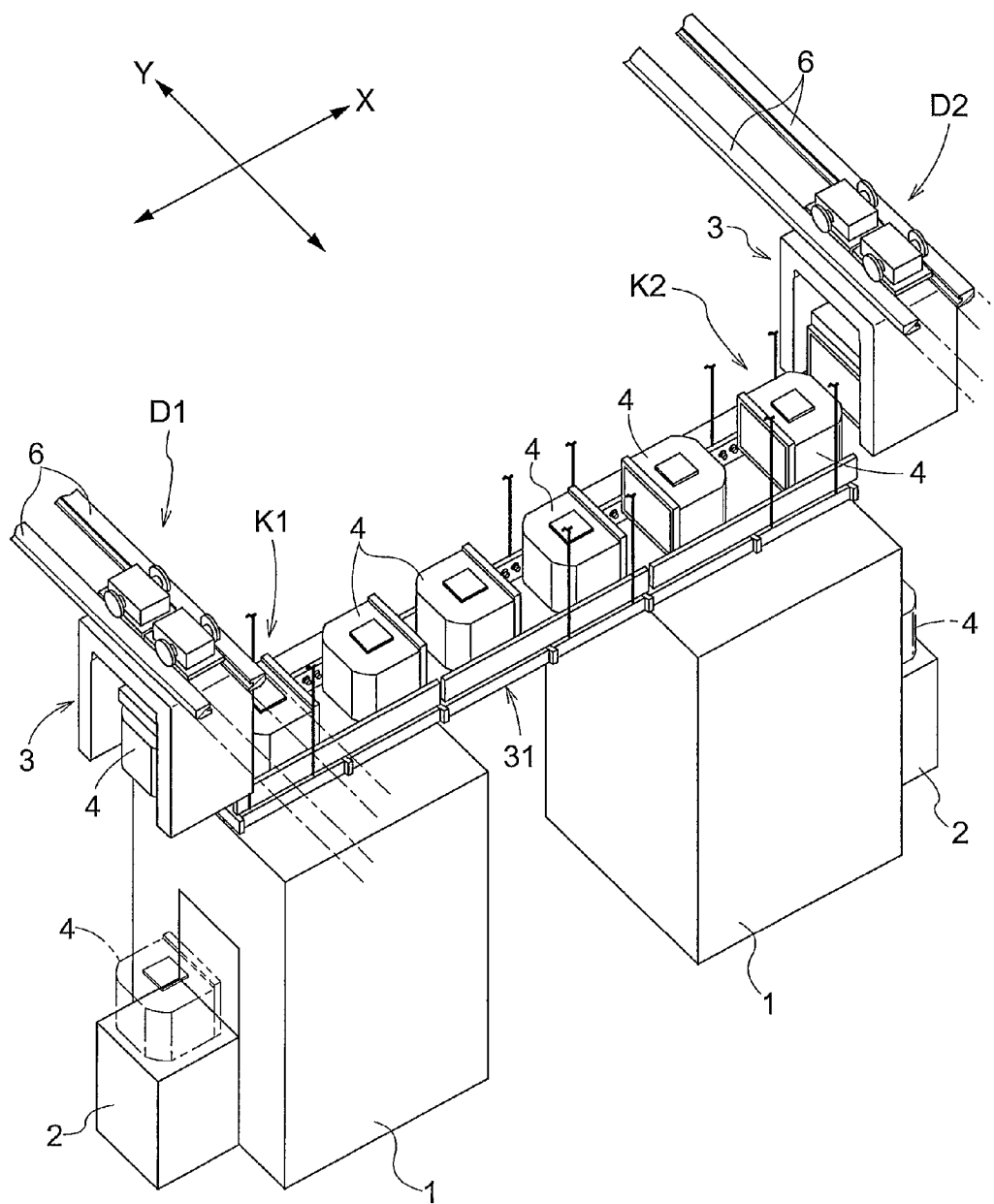
FIG. 5 is a perspective view showing a principal part of the article transport facility.

As shown in FIG. 1, the first travel path portion D1 and the second travel path portion D2 are spaced apart from each other in the path lateral direction (direction X in FIG. 1). And a plurality of article processing devices 1 are arranged and installed along the path longitudinal direction (direction Y in FIG. 1) between the paths of the first travel path portion D1 and the second travel path portion D2. And as shown in FIGS. 2 and 5, a first article transfer location K1 is located at a position to a side of the first travel path portion D1 and on the side of the second travel path portion D2 (i.e., position located laterally of the first travel path portion D1 and on the side of the second travel path portion D2) and a second article transfer location K2 is located at a position to a side of the second travel path portion D2 and on the side of the first travel path portion D1 (i.e., position located laterally of the second travel path portion D2 and on the side of the first travel path portion D1). And an inter-travel-paths transport device 31 for transporting articles 4 between the first article transfer location K1 and the second article transfer location K2 is provided. FIG. 2 shows the first travel path portion D1, the second travel path portion D2, and the article processing devices 1 located between the two paths as seen in the path longitudinal direction. And FIG. 5 is a perspective view showing the first travel path portion D1, the second travel path portion D2, and the article processing devices 1 located between the two paths. The inter-travel-paths transport device 31 is fixedly suspended from and supported by the ceiling and are located so as to extend in the space above or upwardly of the article processing devices 1 to connect the first article transfer location K1 and the second article transfer location K2. As shown in FIG. 1, this inter-travel-paths transport device 31 is located to extend in the space above or upwardly of the article processing devices 1 located in the center region, among the plurality of article processing devices 1 arranged along the path longitudinal direction (direction Y in FIG. 1). And two inter-travel-paths transport devices 31 are provided in each region between the first travel path portion D1 and the second travel path portion D2, with one inter-travel-paths transport device 31 being configured to transport articles 4 from the first travel path portion D1 side toward the second travel path portion D2 side and with the other inter-travel-paths transport device 31 being configured to transport articles 4 from the second travel path portion D2 side toward the first travel path portion D1 side.

As shown in FIGS. 5 and 6, each inter-travel-paths transport device 31 includes a roller conveyor in which driving rollers 32, each of which rotates about a horizontal axis, are arranged in the transporting direction. The driving rollers 32 may be rotated or driven by any conventional method. For example, rotation of each driving roller 32 may be controlled individually by providing one motor to each driving roller 32. Alternatively, the driving rollers 32 may be actuated by providing a pivot shaft which extends along a row of driving rollers 32 and which is rotated by a motor and by connecting this pivot shaft with each of the driving rollers 32 in the row by a gear. FIG. 6 is a plan view of the inter-travel-paths transport device 31. And, while not shown, the inter-travel-paths transport device 31 includes sensors, such as an article sensor for detecting articles 4, in the first article transfer location K1, the second article transfer location K2, and at one or more locations in the transporting path therebetween. And the inter-travel-paths transport device 31 is configured to be able to stop an article 4 at a desired position such as at the first article transfer location K1, the second article transfer location K2, or at any location in the transporting path therebetween by controlling the operation of the driving rollers 32 (i.e., motor(s)) based on detected information from the sensors. These sensors belong to the conventional technology. For example, it is possible to use as a sensor an optical sensor in which a light emitter is located on one side of the transporting path and a light receiver is located in the corresponding position on the opposite side of the transporting path. Alternatively, a sensor may be a sensor which detects an article by physically contacting it.

As shown in FIG. 6, two rows of driving rollers 32 are provided such that the rows are spaced apart from each other in a transport lateral direction which is perpendicular to the transporting direction. And the two rows of the driving rollers 32 are configured to receive and support the ends of an article 4 in the transport lateral direction to transport it. At each of the first article transfer location K1 and the second article transfer location K2, a vertically movable platform 33 (shown with the dotted lines in FIG. 6) which can be raised and lowered between the two rows of driving rollers 32. And the vertically movable platform 33 is configured in such a way that an article 4 can be vertically moved between a supporting position at which the article 4 is received and supported by the driving rollers 32 and a lifted position at which the article 4 is lifted from the driving rollers 32 by raising and lowering the vertically movable platform 33. A plurality of pins that can fit into a plurality of groove portions formed in the bottom of the article 4 are provided in the vertically movable platform 33. And the article is received and supported while the article 4 is properly positioned by the virtue of the fact that these pins fit into corresponding ones of the plurality of groove portions in the bottom of the article 4.

As shown in FIG. 2, the inter-travel-paths transport device 31 is configured to be able to rotate the article 4 about a vertical axis during the transport of the article 4 between the first article transfer location K1 and the second article transfer location K2. More specifically, the inter-travel-paths transport device 31 has, in an intermediate location in its transporting path, a swivel base (not shown) that can be raised and lowered between the two rows of driving rollers 32 and that can be rotated about a vertical axis. A plurality of pins that can fit into a plurality of groove portions formed in the bottom of the article 4 are provided in the swivel base. And the article is received and supported while the article 4 is properly positioned by the virtue of the fact that these pins fit into corresponding ones of the plurality of groove portions in the bottom of the article 4. The inter-travel-paths transport device 31 is configured to receive and support the article with the swivel base with the article 4 properly positioned, by stopping the article 4 above this swivel base and rising the swivel base, and to rotate the article 4 about the vertical axis by rotating the swivel base about the vertical axis.

In addition, as shown in FIGS. 2 and 5, the inter-travel-paths transport device 31 is configured to be able to transport a plurality of articles 4 between the first article transfer location K1 and the second article transfer location K2 by having a plurality of articles 4 arranged in a row in its transportation path. More specifically, since the inter-travel-paths transport device 31 is capable of positioning the articles 4 at any desired positions on the transporting path, as described above, by controlling the actuation of the driving rollers 32, the inter-travel-paths transport device 31 is configured to be able to transport the articles 4 with the articles positioned at a plurality of desired positions on the transporting path.

(Function as a Vertical Movement Slide Transport Device)

As described above, the article transport vehicle 3 has the grip portion 7 such that the grip portion 7 can be raised and lowered and can be slidingly moved in the path lateral direction (direction X in FIG. 2). And as shown in FIG. 2, the article transport vehicle 3 is configured to be capable of vertically moving or raising and lowering the grip portion 7, at the position which overlaps with the first travel path portion D1 in plan view, to transfer an article 4 to and from a station 2 and to be capable of slidingly move the grip portion 7 to transfer the article 4 to and from the first article transfer location K1 of the inter-travel-paths transport device 31 when the vehicle 3 is located in the first travel path portion D1. Similarly, the article transport vehicle 3 is configured to be capable of vertically moving or raising and lowering the grip portion 7, at the position which overlaps with the second travel path portion D2 in plan view, to transfer an article 4 to and from a station 2 and to be capable of slidingly move the grip portion 7 to transfer the article 4 to and from the second article transfer location K2 of the inter-travel-paths transport device 31 when the vehicle 3 is located in the second travel path portion D2. Thus, when in the first travel path portion D1, the article transport vehicle 3 can transport the article 4 between a station 2 and the first article transfer location K1. And when in the second travel path portion D2, the article transport vehicle 3 can transport the article 4 between a station 2 and the second article transfer location K2. Thus, with the grip portion 7 of the article transport vehicle 3 functioning as a holding portion of a vertical movement slide transport device, the article transport vehicle 3 is configured to function also as a vertical movement slide transport device which can move an article 4 vertically and horizontally.

That is, because the inter-travel-paths transport device 31 is provided, and because the article transport vehicle 3 can transfer an article 4 to or from the first article transfer location K1 of the inter-travel-paths transport device 31 and can also transfer an article 4 to or from the second article transfer location K2 of the inter-travel-paths transport device 31, the inter-travel-paths transport device 31 can be used when transporting an article between the first travel path portion D1 and the second travel path portion D2 such as when, for example, transporting an article 4 from an article processing device 1 provided in association with the first travel path portion D1 to an article processing device 1 provided in association with the second travel path portion D2.

The operation for when transporting an article 4 from an article processing device 1 provided in association with the first travel path portion D1 to an article processing device 1 provided in association with the second travel path portion D2 is described next. The facility includes a facility management controller for managing operations of the article transport facility such as operations of the plurality of article transport vehicles 3, vehicle side controllers for controlling operation of the associated article transport vehicles 3 based on the instructions from the facility management controller, and a transport device controller for controlling operations of the inter-travel-paths transport device 31. The articles 4 are transported from the article processing device 1 provided in association with the first travel path portion D1 to the article processing device 1 provided in association with the second travel path portion D2 under the control of these controllers.

As shown in FIGS. 2 and 5, the vehicle side controller of the article transport vehicle 3 that is located closest to the station 2 and on the upstream side with respect to the travel direction, first, controls the travel of the article transport vehicle 3 and stops the article transport vehicle 3 at a stop position that corresponds to a station 2 located under the first travel path portion D1 based on instructions from the facility management controller, etc. Although not shown, the article transport vehicle 3 has a stop plate detection sensor for detecting stop plates installed, for example, on a side of the travel rail 6 to indicate the stop positions corresponding to each station 2. And the vehicle side controller causes the article transport vehicle 3 to stop at the stop position associated with the station 2 in the path in the first travel path portion D1 based on the detected information from this stop plate detection sensor. And in order to transfer the article 4 received from the station 2 to the first article transfer location K1 of the inter-travel-paths transport device 31, the vehicle side controller: causes the grip portion 7 to be lowered at a position that overlaps with the first travel path portion D1 in plan view; causes the gripper 18 to be switched to its open position or the grip release attitude; causes an article 4 to be received from the station 2 by switching the gripper 18 to its gripping position; causes the grip portion 7 to be raised; then, causes the grip portion 7 to be slidingly moved horizontally from the position which overlaps with the first travel path portion D1 in plan view; and after which, causes the grip portion 7 to be lowered and the gripper 18 to be switched to its grip release position. As such, the stop position at which the article transport vehicle 3 causes the grip portion 7 to be raised and lowered to transfer an article 4 to or from the station 2 and the stop position at which the article transport vehicle 3 causes the grip portion 7 to be slidingly moved to transfer the article 4 to or from the first article transfer location K1 are located at the same position in the path in the first travel path portion D1. Thus, the article transport vehicle 3 can transport an article from the station 2 to the first article transfer location K1 by vertically moving and slidingly moving the grip portion 7 while stopped at the stop position associated with the station 2, which allows the transporting of an article from the station 2 to the first article transfer location K1 to be performed smoothly and in a shorter period of time. Incidentally, when transferring an article 4 from the article transport vehicle 3 to the first article transfer location K1, the transport device controller causes the vertically movable platform 33 in the first article transfer location K1 to be raised to the lifted position.

When the vertically movable platform 33 receives an article 4, the transport device controller causes the vertically movable platform 33 to be lowered from the lifted position to the supporting position to cause the driving rollers 32 to receive and support the article 4, and causes the article 4 to be transported toward to the second article transfer location K2. At this point, because, among other reasons, the orientation of the article 4 when supplied to the article processing device 1 is predetermined, the orientation of the article 4 at the time an article transport vehicle 3 transfers it to the first article transfer location K1 is opposite, with respect to the transporting direction of the inter-travel-paths transport device 31, from the orientation of the article 4 at the time an article transport vehicle 3 receives it from the second article transfer location K2. Because of this, the transport device controller causes the article 4 to be rotated about a vertical axis using the swivel base located at an intermediate location in the transporting path to cause the article 4 to be oriented in the opposite direction before being transported to the second article transfer location K2. In addition, the inter-travel-paths transport device 31 not only can transport one article 4 at a time but also can have a row of a plurality of articles 4 in its transporting path to transport a plurality of articles 4 from the first article transfer location K1 to the second article transfer location K2.

When an article 4 is transported to the second article transfer location K2 by the inter-travel-paths transport device 31, the vehicle side controller of the article transport vehicle 3 located closest to the station 2 and on the upstream side with respect to the travel direction controls the travel of the article transport vehicle 3 and causes the article transport vehicle 3 to stop at a stop position in the second travel path portion D1 that corresponds to a station 2 based on instructions from the facility management controller, etc. And in order to transfer the article 4 received from the second article transfer location K2 to the station 2, the vehicle side controller: causes the grip portion 7 to be slidingly moved and then lowered at a position that overlaps with the second travel path portion D2 in plan view; causes the gripper 18 to be switched to its open position or the grip release attitude; causes an article 4 to be received from the station 2; causes the gripper 18 to be switched to its gripping position; then, causes the grip portion 7 to be slidingly moved horizontally to the position which overlaps with the second travel path portion D2 (that is, the position of the article transport vehicle 3); and after which, causes the grip portion 7 to be lowered and the gripper 18 to be switched to its grip release position. As such, the stop position at which the article transport vehicle 3 causes the grip portion 7 to be raised and lowered to transfer an article 4 to or from the station 2 and the stop position at which the article transport vehicle 3 causes the grip portion 7 to be slidingly moved to transfer the article 4 to or from the second article transfer location K2 are located at the same position in the path in the second travel path portion D2. Thus, the article transport vehicle 3 can transport an article from the second article transfer location K2 to the station 2 by vertically moving and slidingly moving the grip portion 7 while stopped at the stop position associated with the station 2, which allows the transporting of an article from the second article transfer location K2 to the station 2 to be performed smoothly and in a shorter period of time. Incidentally, when the article transport vehicle 3 receives an article 4 from the second article transfer location K2, the transport device controller causes the vertically movable platform 33 in the second article transfer location K2 to be raised to the lifted position.

Thus, since articles 4 can be transported from an article processing device 1 provided in association with the first travel path portion D1 to an article processing device 1 provided in association with the second travel path portion D2 using the inter-travel-paths transport device 31, transporting of an article from the article processing device 1 provided in association with the first travel path portion D1 to the article processing device 1 provided in association with the second travel path portion D2 can be accomplished smoothly and in a short period of time, thus improving the transport efficiency.

In the above description of operation, the article transport using the inter-travel-paths transport device 31 is described as one where articles 4 are transported from an article processing device 1 provided in association with the first travel path portion D1 to an article processing device 1 provided in association with the second travel path portion D2. However, the invention is not limited to this. For example, in FIG. 1, the inter-travel-paths transport device 31 can be used also when transporting an article 4 from an article processing device 1 that is located at a position that is different from where the inter-travel-paths transport device 31 is located in the first travel path portion D1 in the path longitudinal direction (direction Y in FIG. 1) to an article processing device 1 provided in association with the second travel path portion D2. In this case, the article transport vehicle 3 is firstly caused to travel to a stop position that corresponds to the station 2 for the article processing device 1 that is located at a position that is different from where the inter-travel-paths transport device 31 is located in the first travel path portion D1 in the path longitudinal direction (direction Y in FIG. 1) And the article transport vehicle 3 receives the article 4 from the station 2 by lowering and raising the grip portion 7. Next, the article transport vehicle 3 is caused to travel to the stop position at which the article 4 is transferred to the first article transfer location K1. Then, the article transport vehicle 3 can slidingly move the grip portion 7 to transfer the article 4 received from the station 2 to the first article transfer location K1.

In addition, an article 4 transported by the inter-travel-paths transport device 31 to the second article transfer location K2 can be transported to an article processing device 1 that is located at a position that is different from where the inter-travel-paths transport device 31 is located in the second travel path portion D2 in the path longitudinal direction (direction Y in FIG. 1). In this case, the article transport vehicle 3 is caused to travel to a stop position at which the article transport vehicle 3 transfers an article 4 to or from the second article transfer position K2 and is caused to slidingly move the gripper 7 to receive the article 4 from the second article transfer position K2. And the article transport vehicle 3 is caused to travel to a stop position that corresponds to a station 2 for the article processing device 1 that is located at a position that is different from where the inter-travel-paths transport device 31 is located in the second travel path portion D2 in the path longitudinal direction (direction Y in FIG. 1) and is caused to vertically move the gripper 7 to transfer the article 4 received from the second article transfer location K2 to that station 2.

Thus, the inter-travel-paths transport device 31 can be used effectively to execute the transporting operations smoothly and to improve transport efficiency, not only when transporting articles 4 from an article processing device 1 provided in association with the first travel path portion D1 to an article processing device 1 provided in association with the second travel path portion D2, but when transporting articles 4 between the first travel path portion D1 and the second travel path portion D2.

Alternative Embodiments (1) In the embodiment described above, the article transport vehicle 3 functions as a vertical movement slide transport device with the grip portion 7 of the article transport vehicle 3 functioning as a holding portion of a vertical movement slide transport device. Alternatively, the vertical movement slide transport device may be provided independently from the article transport vehicle 3. More specifically, a vertical movement slide transport device is provided at a location higher than the article processing devices 1 on the first travel path portion D1 side and on the second travel path portion D2 side. And each vertical movement slide transport device has the holding portion for holding an article 4 such that the holding portion can be moved vertically and slidingly moved in the path lateral direction, and is configured to vertically move the holding portion at the position that overlaps with the corresponding path portion (either the first travel path portion D1 or the second travel path portion D2) in plan view to transfer an article 4 to or from a station 2 and to transfer an article to or from the article transfer location of a corresponding path portion (either the first article transfer location K1 or the second article transfer location K2) by slidingly moving the holding portion. Or as a vertical movement slide transport device, one that is provided to the article transport vehicle 3 described in the embodiment described above may be used. In this case, for example, by providing an article storage unit that can temporarily store an article 4 to a side of the first travel path portion D1 and to a side of the second travel path portion D2, the vertical movement slide transport device may be configured to transfer an article 4 also to the article storage unit by slidingly moving the holding portion. When thus configured, the vertical movement slide transport device can not only transport an article between a station 2 and the inter-travel-paths transport device 31, but can also transport an article between a station 2 and an article storage unit, and between the inter-travel-paths transport device 31 and an article storage unit.

(2) While an example was described as having two inter-travel-paths transport devices 31 between the first travel path portion D1 and the second travel path portions D2 in the embodiment described above, the number of the inter-travel-paths transport devices 31 may be selected suitably, and may be one or three or more. For example, when one inter-travel-paths transport device 31 is provided, by enabling the transporting direction of the inter-travel-paths transport device 31 to be reversed, the one inter-travel-paths transport device 31 can perform both an article transport from the first travel path portion D1 to the second travel path portion D2 as well as an article transport from the second travel path portion D2 to the first travel path portion D1.

(3) While the inter-travel-paths transport device 31 is configured to rotate an article 4 about a vertical axis while the article is transported and to transport a plurality of articles 4 arranged in a row on its transport path in the embodiment described above, it is not necessary for the inter-travel-paths transport device 31 to have such a configuration. In addition, although the roller conveyor was used as an example of the inter-travel-paths transport device 31, it does not have to be a roller conveyor. For example, a transport device may be used that includes a support member for receiving and supporting an article 4 which can travel between the first article transfer location K1 and the second article transfer location K2. And various other transporting devices may be used instead, including a conveyer.

(4) In the embodiment described above, an example was described where the stop position at which the article transport vehicle 3 causes the grip portion 7 to be raised and lowered to transfer an article 4 to or from a station 2 and the stop position at which the article transport vehicle 3 causes the grip portion 7 to be slidingly moved to transfer an article 4 to or from the first article transfer location K1 or the second article transfer location K2 are located at the same position in the first travel path portion D1 or the second travel path portion D2. The installation position of the inter-travel-paths transport device 31 in the first travel path portion D1 and the second travel path portion D2 in the path longitudinal direction may be arranged differently to suit the needs. Therefore, a position between two neighboring stations 2 in the first travel path portion D1 and the second travel path portion D2 may be selected as the stop position at which the article transport vehicle 3 causes the grip portion 7 to be slidingly moved to transfer an article 4 to or from the first article transfer location K1 or the second article transfer location K2.

What is claimed is:

1. An article transport facility comprising:

two or more article processing devices installed on the ground side and an article transferring point provided on the ground side in association with each of the article processing devices;

a plurality of article transport vehicles that transport articles among the article processing devices;

travel paths which are installed on the ceiling side and in which the plurality of article transport vehicles travel, the travel paths including a first travel path portion and a second travel path portion which are spaced apart from each other in a path lateral direction wherein a plurality of the article processing devices are arranged along a path longitudinal direction between the first travel path portion and the second travel path portion such that at least one article processing device and an associated article transferring point are located in association with the first travel path portion and such that at least one article processing device and an associated article transferring point are located in association with the second travel path portion;

an inter-travel-paths transport device that extends in a space upwardly of the article processing devices arranged between the first travel path portion and the second travel path portion, to transport an article between a first article transfer location located laterally of the first travel path portion and on a second travel path portion side in plan view and a second article transfer location located laterally of the second travel path portion and on a first travel path portion side in plan view wherein the inter-travel-paths transport device is positioned to connect the first article transfer location and the second article transfer location;

a first vertical movement slide transport device that is fixedly or movably located in an area of the first travel path portion, the first vertical movement slide transport device having a holding portion for holding an article such that the holding portion can be moved vertically and can be slidingly moved in the lateral direction of the first travel path portion, wherein the first vertical movement slide transport device is configured to transfer an article to or from the article transferring point of the at least one article processing device located in association with the first travel path portion by vertically moving the holding portion at a position that overlaps with the first travel path portion in plan view and to transfer an article to or from the first article transfer location by slidingly moving the holding portion in the path lateral direction of the first travel path portion;

a second vertical movement slide transport device that is fixedly or movably located in an area of the second travel path portion, the second vertical movement slide transport device having a holding portion for holding an article such that the holding portion can be moved vertically and can be slidingly moved in the lateral direction of the second travel path portion, wherein the second vertical movement slide transport device is configured to transfer an article to or from the article transferring point of the at least one article processing device located in association with the second travel path portion by vertically moving the holding portion at a position that overlaps with the second travel path portion in plan view and to transfer an article to or from the second article transfer location by slidingly moving the holding portion in the path lateral direction of the second travel path portion.

2. An article transport facility as defined in claim 1, wherein
   each of the article transport vehicles has a grip portion for gripping an article as the holding portion such that the grip portion can be vertically moved and can be slidingly moved in the path lateral direction of the first travel path portion and the second travel path portion wherein each of the article transport vehicles is configured to function as the first vertical movement slide transport device when located in the first travel path portion and to function as the second vertical movement slide transport device when located in the second travel path portion.

3. An article transport facility as defined in claim 2, wherein
   a stop position at which the article transport vehicle transfers an article to or from the article transferring point of the at least one article processing device located in association with the first travel path portion by vertically moving the grip portion and a stop position at which the article transport vehicle slidingly moves the grip portion to transfer an article to or from the first article transfer location are defined to be at the same location in the first travel path portion, and wherein
   a stop position at which the article transport vehicle transfers an article to or from the article transferring point of the at least one article processing device located in association with the second travel path portion by vertically moving the grip portion and a stop position at which the article transport vehicle slidingly moves the grip portion to transfer an article to or from the second article transfer location are defined to be at the same location in the second travel path portion.

4. An article transport facility as defined in claim 1, wherein
   the inter-travel-paths transport device is configured to be capable of rotating an article about a vertical axis between the first article transfer location and the second article transfer location.

5. An article transport facility as defined in claim 1, wherein
   the inter-travel-paths transport device is configured to have a plurality of articles arranged along a transporting path to be able to transport a plurality of articles between the first article transfer location and the second article transfer location.

\* \* \* \* \*